US010508469B2

(12) United States Patent
Wong

(10) Patent No.: US 10,508,469 B2
(45) Date of Patent: Dec. 17, 2019

(54) GASKET SYSTEM FOR AN ELECTROMECHANICAL LOCK

(71) Applicant: ASSA ABLOY Residential Group, Inc., New Haven, CT (US)

(72) Inventor: Wai P. Wong, Orange, CT (US)

(73) Assignee: ASSA ABLOY Residential Group, Inc., New Haven, CT (US)

( * ) Notice: Subject to any disclaimer, the term of this patent is extended or adjusted under 35 U.S.C. 154(b) by 0 days.

(21) Appl. No.: 15/908,687

(22) Filed: Feb. 28, 2018

(65) Prior Publication Data

US 2018/0266142 A1  Sep. 20, 2018

Related U.S. Application Data

(60) Provisional application No. 62/472,234, filed on Mar. 16, 2017.

(51) Int. Cl.
*E05B 17/00* (2006.01)
*E05B 9/02* (2006.01)
(Continued)

(52) U.S. Cl.
CPC .............. *E05B 17/002* (2013.01); *E05B 9/02* (2013.01); *F16J 15/025* (2013.01); *F16J 15/106* (2013.01); *E05B 49/00* (2013.01); *H05K 5/061* (2013.01)

(58) Field of Classification Search
CPC .......... E05B 17/002; E05B 9/02; E05B 49/00; F16J 15/106; F16J 15/025; F16J 15/06; H05K 5/061
(Continued)

(56) References Cited

U.S. PATENT DOCUMENTS 1,603,341 A * 10/1926 Hyatt ........................ E05B 3/06
292/348
2,356,658 A * 8/1944 Dean ......................... E05B 3/06
292/356
(Continued)

FOREIGN PATENT DOCUMENTS

JP  H07-197708 A   8/1995
JP  2007/071333 A  3/2007
(Continued)

OTHER PUBLICATIONS

International Search Report and Written Opinion for International Application No. PCT/US2018/029373, dated Jul. 23, 2018.
(Continued)

*Primary Examiner* — Lloyd A Gall
(74) *Attorney, Agent, or Firm* — Wolf, Greenfield & Sacks, P.C.

(57) ABSTRACT

A gasket system for an electromechanical locking device includes an inner gasket for the door facing surface of the device. The peripheral edge of the inner gasket and the peripheral edge of the housing of the device include complementary step features that interact to compress the peripheral edge of the inner gasket to seal the housing and mitigate air and water flow into the locking device. Some embodiments of the device include an "L" shaped front gasket that is compressed between stepped features of two portions of the housing to further mitigate air and water flow. Openings in the gaskets for lock components are circumferentially surrounded by compressible ribs that extend from the surface of the gasket. The compressible ribs are compressed against the surface of the door preventing air and water from migrating through openings.

16 Claims, 10 Drawing Sheets

(51) Int. Cl.
*H05K 5/06* (2006.01)
*F16J 15/02* (2006.01)
*F16J 15/10* (2006.01)
*E05B 49/00* (2006.01)

(58) Field of Classification Search
USPC .. 70/277, 278.1, 278.2, 278.3, 278.7, 279.1, 70/280–283, 283.1; 109/75; 292/356; 277/630, 637
See application file for complete search history.

(56) References Cited

U.S. PATENT DOCUMENTS

| | | | |
|---|---|---|---|
| 3,154,302 | A | 10/1964 | Maruyama |
| 4,573,723 | A | 3/1986 | Morita et al. |
| 4,691,584 | A | 9/1987 | Takaishi et al. |
| 7,350,382 | B2 | 4/2008 | Hoffmann |
| 8,141,400 | B2 | 3/2012 | Sorensen et al. |
| 9,441,403 | B2 * | 9/2016 | Kraus ................... E05B 85/16 |
| 2001/0040037 | A1 * | 11/2001 | Negishi ................. H05K 5/061 174/17 CT |
| 2003/0107187 | A1 * | 6/2003 | Yajima ................... F16J 15/025 277/628 |
| 2004/0134245 | A1 | 7/2004 | Jasper |
| 2006/0017234 | A1 * | 1/2006 | Kuo ....................... F16J 15/025 277/630 |
| 2006/0174668 | A1 | 8/2006 | Miller et al. |
| 2006/0267293 | A1 * | 11/2006 | Hazel ..................... F16J 15/061 277/637 |
| 2007/0159774 | A1 * | 7/2007 | Savary ................... H01G 2/103 361/600 |
| 2011/0097227 | A1 * | 4/2011 | Cai ....................... F04B 43/026 417/472 |
| 2014/0206420 | A1 * | 7/2014 | Neichi ................ H04M 1/0249 455/575.8 |
| 2014/0268521 | A1 * | 9/2014 | Kawai ................... H05K 5/061 361/679.01 |
| 2014/0338409 | A1 * | 11/2014 | Kraus ..................... E05B 81/76 70/278.1 |
| 2015/0096339 | A1 * | 4/2015 | Behnke .................. E05B 85/06 70/237 |
| 2016/0115720 | A1 | 4/2016 | Wong et al. |
| 2016/0273654 | A1 * | 9/2016 | Yu .......................... F16J 15/025 |
| 2017/0037937 | A1 | 2/2017 | Ku |
| 2018/0124939 | A1 * | 5/2018 | Hung .................. H05K 5/0008 |
| 2018/0320413 | A1 | 11/2018 | Wong |

FOREIGN PATENT DOCUMENTS

| | | |
|---|---|---|
| JP | 4314889 B2 | 8/2009 |
| KR | 0118627 Y1 | 8/1998 |
| KR | 20-0428317 Y1 | 10/2006 |
| WO | WO 81/00899 A1 | 4/1981 |
| WO | WO 92/12317 A1 | 7/1992 |

OTHER PUBLICATIONS

International Search Report and Written Opinion for International Application No. PCT/US2018/020328, dated May 30, 2018.
Gallagher, How much torque do I need to spin my keys inside a keyhole. Stack Exchange. https://physics.stackexchange.com/q/321967, 3 pages. Mar. 28, 2017.

* cited by examiner

GASKET SYSTEM FOR AN ELECTROMECHANICAL LOCK

RELATED APPLICATIONS

This Application is a Non-Provisional of U.S. Provisional Application Serial No. 62/472,234, filed Mar. 16, 2017, entitled "GASKET SYSTEM FOR OUTSIDE SEALING OF ELECTROMECHANICAL LOCK AGAINST WATER CONDENSATION.

FIELD

Disclosed embodiments are related to devices for sealing electromechanical locks for doors from adverse environmental conditions.

BACKGROUND

It has become increasingly common for exterior doors to be equipped with electromechanical locking systems. Such locking systems include electrical hardware. Often, these electromechanical locking systems include portions mounted on both the inside and outside surfaces of the door. The electrical hardware mounted on the outside of exterior doors are normally protected from tampering or the environment by a housing.

SUMMARY

In one embodiment, an electromechanical locking device for a door is provided. The device includes a housing having an open back with a stepped edge formed around the periphery of the open back of the housing. The stepped edge is defined by a distal flat surface substantially parallel to a door surface, a perpendicular surface extending perpendicularly away from the door surface from the distal flat surface, and an inner ledge portion extending parallel to the door surface from the perpendicular surface. A gasket is constructed and arranged to cover the open back of the housing, having a step extending from edges of the gasket. The step is sized and shaped to conform to the stepped edge such that, in an undeformed, state the gasket is disposed over the open back of the housing with the step contacting both the perpendicular surface and the inner ledge portion of the stepped edge. When the housing is installed on the door, the distal flat surface of the housing contacts the door surface, and the step of the gasket is compressed and deformed between the inner ledge portion of the housing and the door surface, mitigating passage of water or air into the housing.

In another embodiment, an electromechanical locking device is provided. The device includes a housing having an open back with a stepped edge formed around the periphery of the open back of the housing. The stepped edge is defined by a distal flat surface substantially parallel to a door surface, a perpendicular surface extending perpendicularly away from the door surface from the distal flat surface, and an inner ledge portion extending parallel to the door surface from the perpendicular surface. A gasket is constructed and arranged to cover the open back of the housing. The gasket has a step extending from edges of the gasket. The gasket further includes one or more openings and a corresponding perpendicularly extending compressible rib surrounding the opening. The step is sized and shaped to conform to the stepped edge such that, in an undeformed, state the gasket is disposed over the open back of the housing with the step contacting both the perpendicular surface and the inner ledge portion of the stepped edge. When the housing is installed on the door, the distal flat surface of the housing contacts the door surface, and the step of the gasket is compressed between the inner ledge portion of the housing and the door surface, mitigating passage of water or air into the housing. When the housing is installed on the door, the compressible rib contacts the door surface and is compressed to further mitigate passage of water or air into the housing.

In yet another embodiment, a gasket for a locking device for a door is provided. The gasket includes an elongated planar body and a peripheral edge having a step extending from the peripheral edge. One or more openings are formed through the body. A corresponding compressible rib surrounds the opening extending perpendicularly from the planar body.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings.

DETAILED DESCRIPTION

Figure 1:
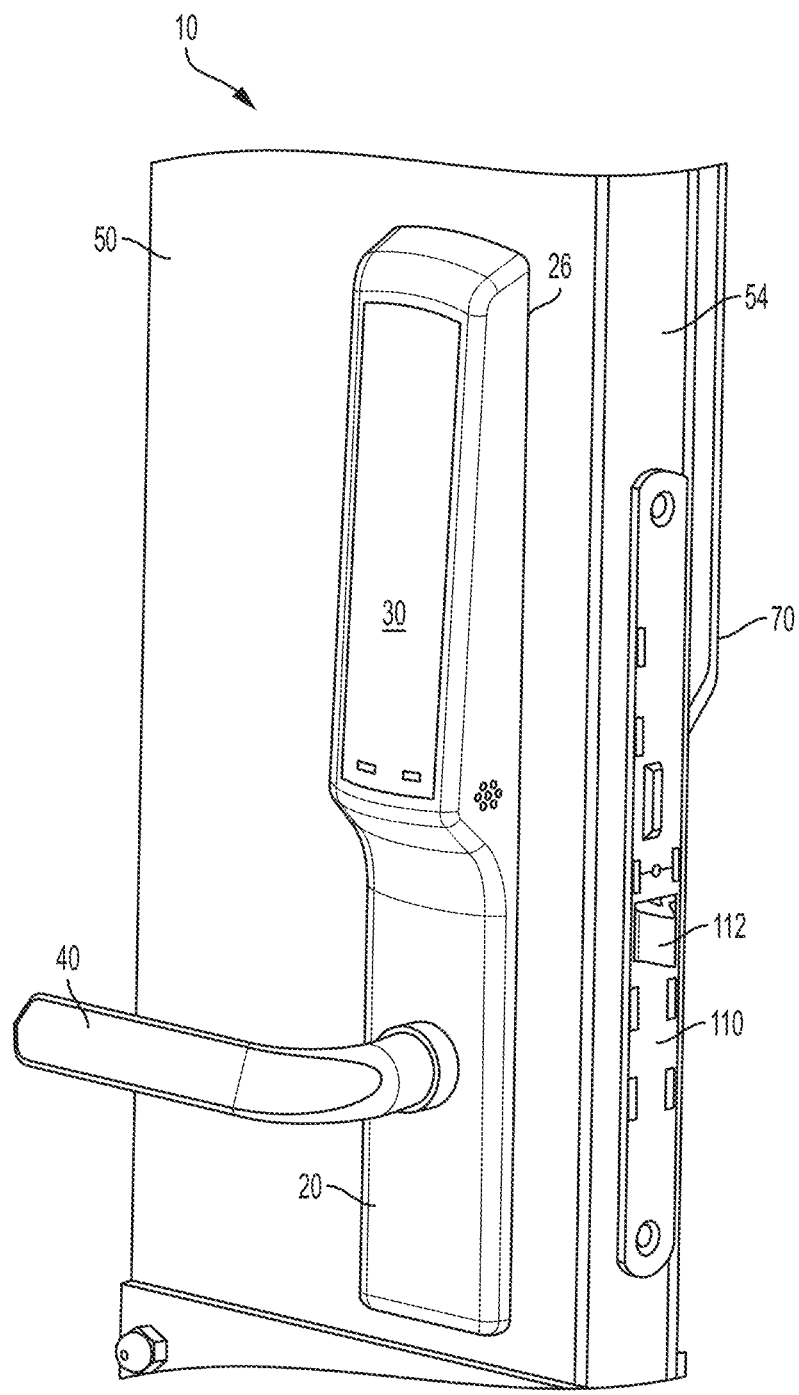
FIG. 1 is a front, right perspective view of the exterior portion of an electromagnetic door lock, mounted to an exterior of a door, including a gasket system according to one embodiment.

When exterior portions of electromechanical door locks are installed, it is unlikely that the internal environment of those exterior portions are entirely isolated from the external environments. Air from the environment could enter the housing of the electromechanical door lock from any gap in the housing, whether the gap was intentional or not. For example, air from the environment could enter from the inside of the door through door prep holes, from around the exterior housing through any gaps between housing components or between the housing and the door, from any gap formed between the housing and the handle extending from the housing, or from any other naturally formed gap or accidentally formed gap in the housing. Since the air within the housing is partially isolated from the environment, the internal temperature and humidity does not immediately change as the environment changes and instead slowly equilibrates with the environment as environmental air leaks into the housing.

In regions where temperature and humidity changes dramatically over the course of a day, when the environment warms up, hot and humid air can enter into the housing of an electromechanical lock, contacting the colder air within. Similarly, when the environment cools, cold and dry air can leak into the housing and contact warmer and more humid within the housing. Due to the possibility of gas exchange between the inside and outside of the housing, without wishing to be limited to theory, the changing conditions within the housing can result in condensation forming within the housing. As one of skill in the art would understand, condensation making contact with either the electrical or mechanical components of the electromechanical lock system could lead to damage of the electromechanical lock system. Recognizing this possibility, the inventors have contemplated that electromechanical locks could be improved.

In one embodiment, a gasket system is provided. The electromechanical door lock includes specifically designed gaskets and housing, shaped such that the gaskets are compressed between portions of the electromechanical door lock housing and/or the door such that the volume of the gaskets expand in non-compressed areas, creating a seal to mitigate gas exchange or water flow between the inside of the housing and the outside of the housing.

For the purposes of this disclosure, the terms "inner" and "inward" refer to being closer to the door and the terms "outer" and "outward" refer to being further from the door. The terms "upper" and "upward" refer to the direction away from the ground, while the terms "lower" and "downward" refer to the direction pointing towards the ground. One of skill in the art should understand that although the embodiments herein are described as being in a certain orientation, the systems and devices described are not limited to the described orientation and could function and apply in different orientations as well. The side of the door facing the area to be secured will be referred to as the "inside," and the side opposite the area to be secured will be referred to as the "outside."

It should be understood that unless otherwise differentiated, when air and/or water flow is referred to as entering or potentially entering the housing, or the exterior or interior portions of the electromechanical door lock, unless otherwise differentiated, both refer to air and/or water penetrating beyond the surfaces of the electromechanical door lock that are intended to contact the outside environment such that air and/or water enters the internal environment of the electromechanical door lock.

In some embodiments of the gasket system, the exterior housing of the electromechanical door lock includes a substantially "L" shaped outer gasket. When the electromechanical door lock is fully assembled, outer gasket is compressed in multiple directions. As will be detailed below, the "L" shape corresponds to a matching step features at the edges of the housing portions. The step features allows the outer gasket, when compressed, to mitigate air or water flow in both the x-axis pointing towards and away from the door, and the y-axis pointing towards and away from the ground.

In some embodiments, the gasket system includes an inner gasket sized and shaped to match the entire inner side of the exterior portion of the electromechanical door lock. In these embodiments, the inner gasket is positioned between the exterior portion of the electromechanical door lock and the door. Similarly to the interactions between the housing and the outer gasket, the edges of the inner gasket could include step portions that cause the edges of the inner gasket to be compressed in multiple directions when the electromechanical lock is fully assembled, obstructing the possible flow of air or water into critical regions of the electromechanical door lock.

In some embodiments, the inner gasket includes a plurality of openings that could be designed to permit the passage of components from the electromechanical door lock that are designed to extend into or through the door. For example, these components could include but are not limited to: fasteners to secure the housing, power and/or signal connections, and/or drive bars connecting to the latch. In these embodiments, the inner gasket mitigates air or water flow entering the exterior portions of the electromechanical door lock by sealing off the exterior housing sections, for example, by sealing off from the door and potential gaps between the exterior portion and the door.

The inventors have also recognized that if the openings in the inner gasket are not exactly the same size as the component that extends through the opening, a passage for air and water to enter the exterior portions of the electromechanical door lock could be created. Accordingly, in some embodiments, the inner gasket could further include a plurality of compressible ribs that extend from the surface of the inner gasket and circumferentially surround the openings. The compressible ribs are flexible enough that when the exterior portion of the electromechanical door lock is mounted to the door, the ribs are compressed to a sufficient degree against the surface of the door such that the exterior portion can mount flush against the door and allow the compressed ribs, circumferentially surrounding the openings, to reduce air and water from the environment from entering the openings.

The inventors have further recognized that the environment on the inside of the door could also be a source of air or water that could cause damage to the electromechanical door lock. Air or water from the environment inside the door could pass between the interior portion of the electromechanical lock and the door causing damage in the interior portion of the lock, or the air or water could enter the door prep holes and cause damage in the exterior portion of the electromechanical door lock. To account for at least this, some embodiments of the electromechanical door lock include an interior gasket substantially covering the entire door facing surface of the interior portion of the electromechanical door lock. Just as with the inner gasket of the exterior portion of the electromechanical door lock, in one embodiment, the edges of the interior gasket of the interior portion could include step portions that cause the edges of the interior gasket to be compressed in multiple directions when the electromechanical lock is fully assembled, obstructing the possible flow of air or water. Additionally, the interior gasket could also include openings for the passage of lock components, where the openings are circumferentially surrounded by compressible ribs extending from the surface of the interior gasket. Similarly to the compressible ribs of the inner gasket of the exterior portion, the compressible ribs of the interior gasket serve to mitigate air and water from the environment entering the openings of the interior gasket.

The inventors have also contemplated that air and water could enter the exterior portion through a possible gap between the door handle and the housing of the exterior portion around it. In some embodiments, the gasket system includes an O-ring wrapped around a bushing that protects the housing around aperture from which the handle extends from. When insulated, the O-ring is compressed between the housing of the exterior portion and the hushing, obstructing potential air and water flow into the exterior portion from the environment.

In some embodiments, the edges of the gaskets and the compressible ribs could include additional ridges of material that protrude from the surfaces of the gaskets. These additional ridges may be compressed when the gaskets are compressed, providing additional gasket sealing material to further ensure that air and gas flow is obstructed between the compressing surfaces.

Turning now to the figures, specific non-limiting embodiments are described in further detail. It should be understood that the various systems, components, features, and methods described relative to these embodiments may be used either individually and/or in any desired combination as the disclosure is not limited to only the specific embodiments described herein.

Figure 2:
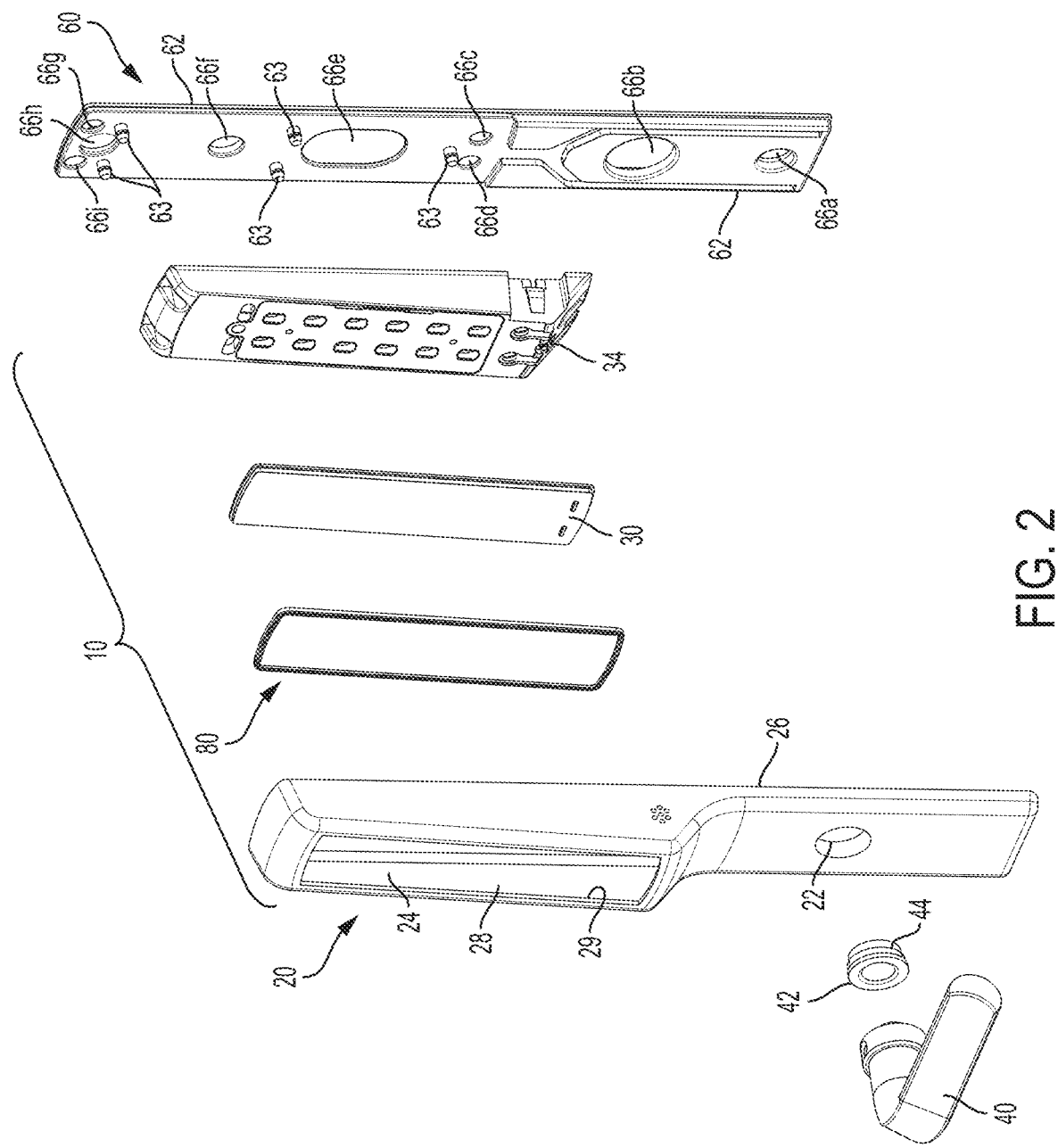
FIG. 2 is a right, exploded view of the exterior portion of the electromagnetic door lock of FIG. 1.
Figure 6:
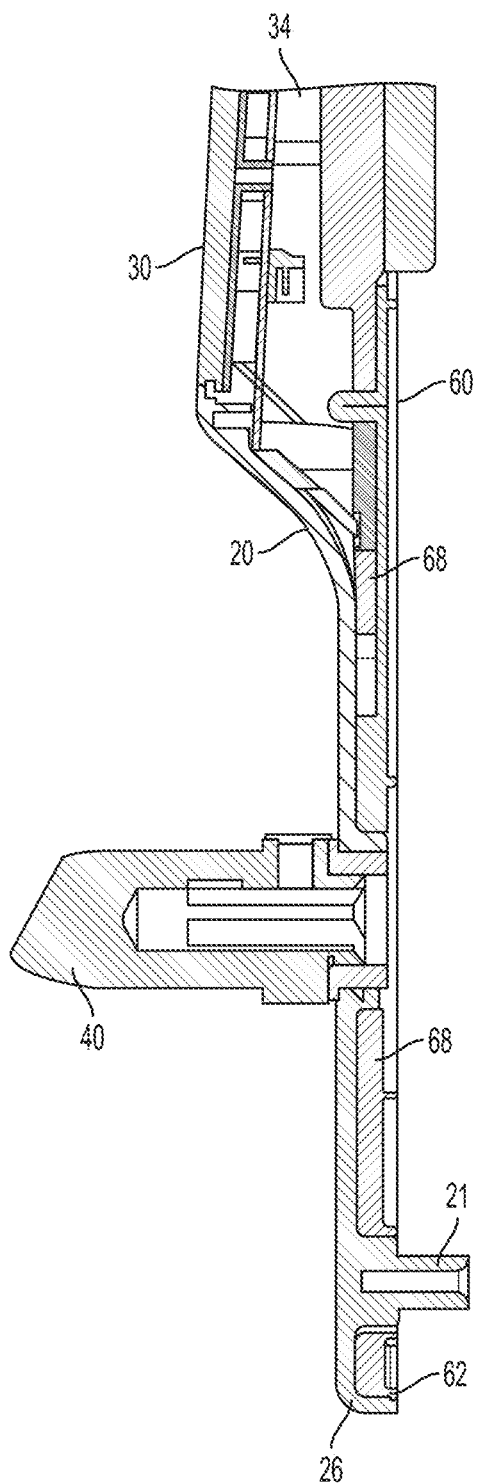
FIG. 6 is a left, cross-sectional view of a lower portion of the exterior portion of the electromagnetic door lock of FIG. 1.

Unless otherwise distinguished, herein the electromechanical door lock will be referred to as an EM locking device. The EM locking device, when installed, may partially occupy both the inside and outside surfaces of a door. FIGS. 1 and 2 show the exterior portion of the EM locking device. In this embodiment of EM locking device 10, the device comprises an exterior housing 20 installed on the outside surface of a door 50. Exterior housing 20 has an open back and a front opening 28 for receiving the lock and housing components. Fasteners may be attached through the door to secure housing 20 to the outside door surface. For example, a fastener could be received by fastener projection 21 (shown in FIG. 6), which in some embodiments contains a threaded hole to receive a fastener extending through the door 50. An inner gasket 60 covers the open back of exterior housing 20, forming the inner surface of exterior housing 20 between the housing and the door surface. In one embodiment, inner gasket 60 is formed of a substantially elongate and planar body configured to substantially covers the entire open back of exterior housing 20, with the exception of openings 66a-66i, which allow the passage of fasteners for securing the housing, power and/or signal connections, and/or drive mechanisms operatively connecting the EM lock device to the door latch or deadbolt. It should be understood that embodiments of the EM locking device could have as many or as few openings as needed depending on the number of components designed to project from within the locking device to the door.

In this embodiment of the EM locking device, printed circuit board housing 34 is secured within the interior portion 24 of exterior housing 20. Touch pad 30 is installed over printed circuit board housing 34 and is accessible through front opening 28 of housing 20. An outer gasket 80 is installed around the perimeter of the outside face of touch pad 30, between the touch pad and the front opening edge 29.

The inner and outer gaskets 60 and 80, respectively, could be made of a flexible polymer or flexible plastic that is capable of creating air-tight and water-tight seals when compressed; that is, when outer gasket 80 is compressed between the touch pad 30 and housing 20 or when inner gasket 60 is compressed between the housing 20 and the door 50, to mitigate passage of water and air into the device. The inner and outer gaskets 60 and 80 are specifically shaped to interact with reciprocal features on housing 20 to create a multi-directional water and air seal as will be described below. In some embodiments, inner gasket 60 includes compression plug members 63 that extend from the surface of the gaskets that face the EM locking device 10. The plug members 63 can be inserted into corresponding receiving holes in the housings. The receiving holes are slightly smaller in diameter than the plug members, causing the plug members to be compressed upon insertion, thereby retaining the plug members and attaching the gaskets to the housings. One of skill in the art should understand that any other method of attaching the gaskets to the housings could be used including but not limited to: adhesives, snap attachments, latch attachments, or other methods of compression attachment.

Figure 11:
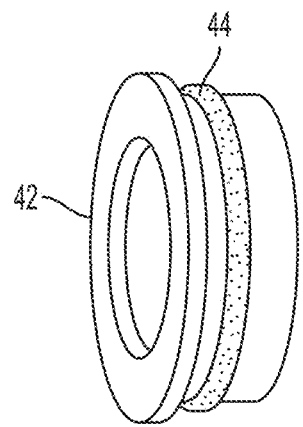
FIG. 11 is a perspective view of an O-ring seal and bushing of the gasket system according to one embodiment.
Figure 13:
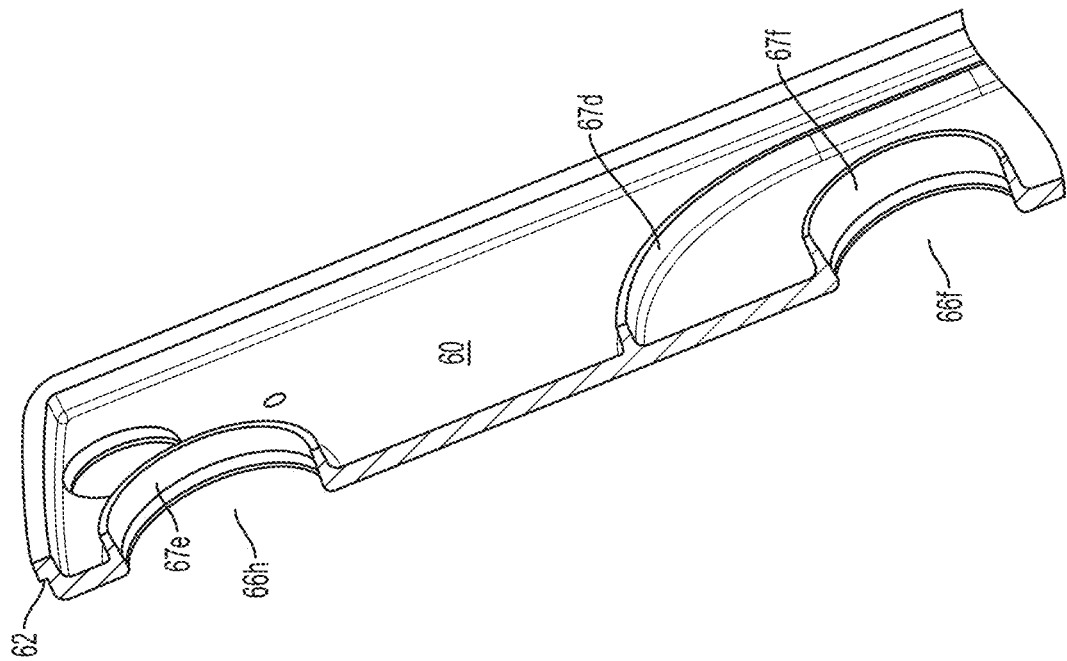
FIG. 13 is a perspective, cross-sectional view of the inner gasket taken along line 13-13 of FIG. 12.
Figure 12:
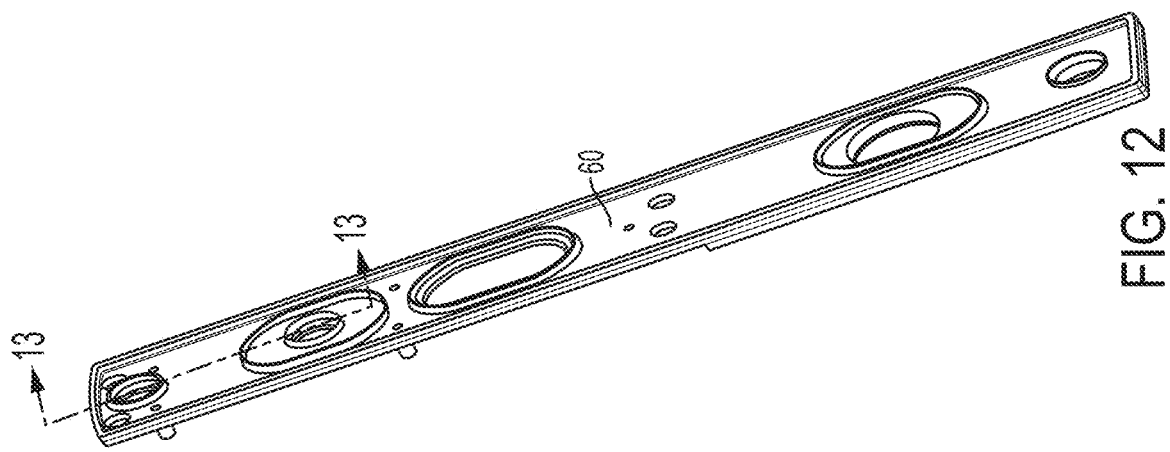
FIG. 12 is a perspective view of the inner gasket.

The lower portion of the exterior housing 20 contains a handle opening 22 for receiving a handle bushing 42, which further rotatably receives a lever handle 40. An O-ring 44 is received in a groove extending around the outer periphery of bushing 42 (as seen in FIG. 11). When the exterior housing 20 is fully assembled, O-ring 44 creates an air and water-tight seal between the exterior housing 20 and bushing 42. The lower portion 68 of inner gasket 60 covers the entire open-backed lower portion of the exterior housing 20. Handle opening 22 is additionally sealed on the inner side of the exterior housing by a circumferential compressible rib 66b that extends from the inner surface of inner gasket 60 as will be described below. The combined sealing from outer gasket 80 and O-ring 44 together mitigate any air or water flow into exterior housing 20 from the environment facing sides of the housing 20.

Figure 7:
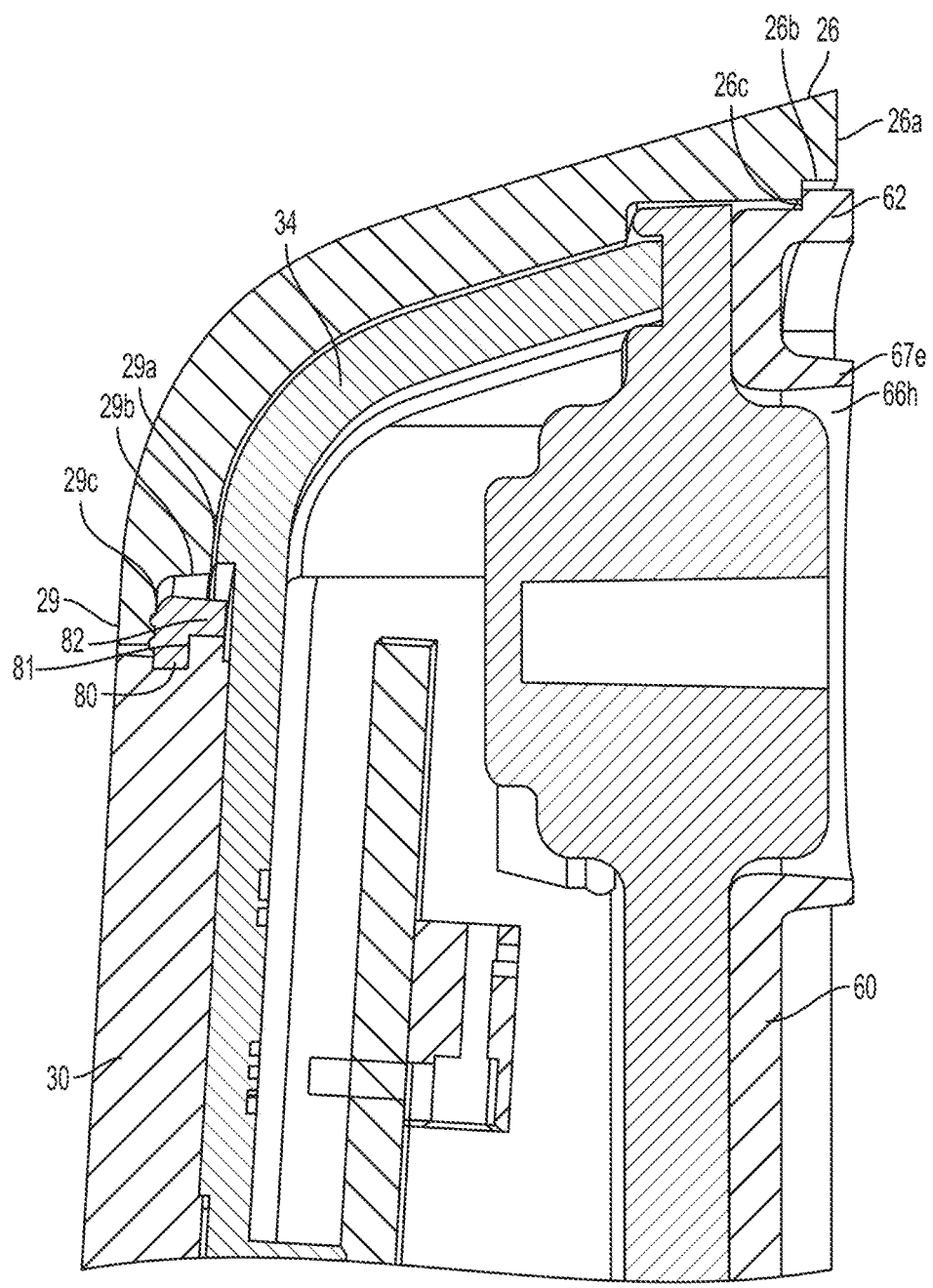
FIG. 7 is a left, enlarged, cross-sectional view of an upper portion of the exterior portion of the electromagnetic door lock of FIG. 1.
Figure 8:
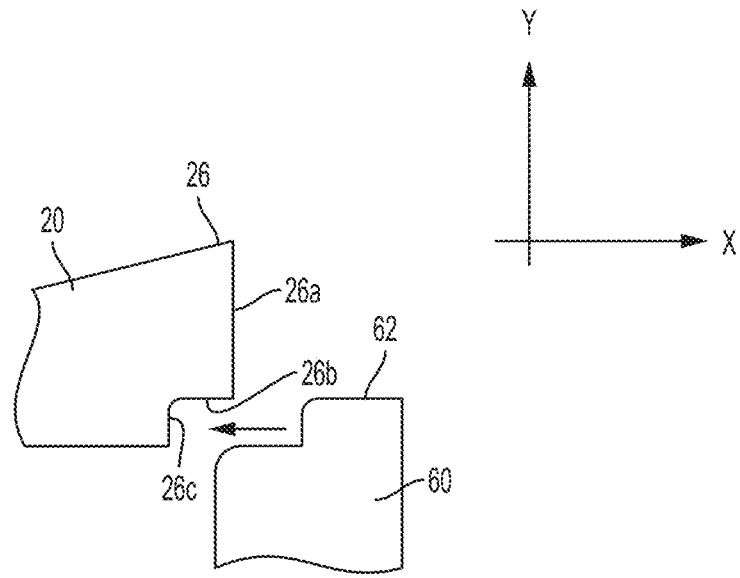
FIG. 8 is a schematic, exploded, cross-sectional view of an edge of an inner gasket of the gasket system of FIG. 1, prior to the electromechanical door lock being secured to the door.
Figure 9:
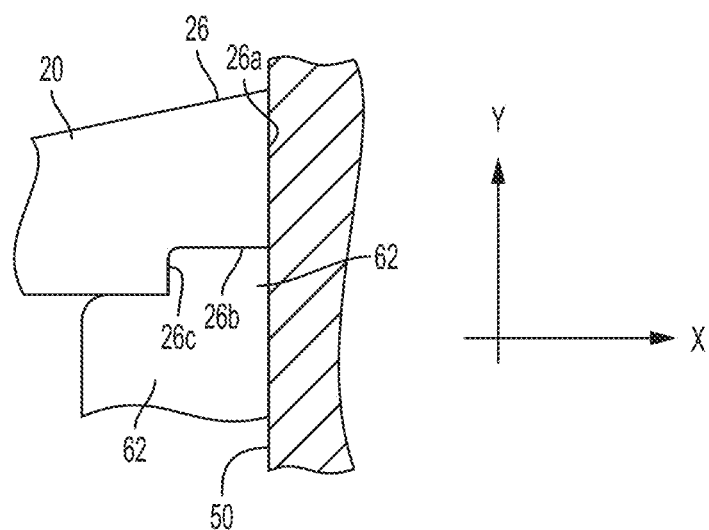
FIG. 9 is a schematic, cross-sectional view of the edge of the inner gasket of FIG. 8, after the electromechanical lock is secured to the door.

To provide additional sealing efficacy, the gaskets and housings of EM locking device 10 are designed such that the gaskets and housings cooperate, when fully assembled, to obstruct air and water flow in multiple directions. In some embodiments of the EM locking device, the edges of exterior housing 20 include a step feature that enhances interference with, and compression of, a corresponding step feature at the edges of inner gasket 60 and outer gasket 80. As shown in FIGS. 7-9, exterior housing 20 has a stepped peripheral edge 26 extending partially over inner gasket 60. Stepped edge 26 has an outer flat surface 26a substantially parallel to the surface of door 50 (shown schematically in FIG. 9). Outer flat surface 26a defines the inside-most face of stepped edge 26. The step is further defined by a recessed corner comprising perpendicular surface 26b extending from outer flat surface 26a perpendicular to the surface of the door, and inner ledge portion 26c, which is parallel but further outward than the door and outer flat portion 26a. In this embodiment, stepped edge 26 spans the entire perimeter of the exterior housing 20. However, it should be understood by one of skill in the art that the stepped edge 26 does not have to exist continuously around the entire perimeter and could only be utilized in components of the housing depending on design requirements of the housing.

To fit with stepped edge 26 to form a multi-directional seal, inner gasket 60 has a corresponding reciprocal stepped edge 62. In an undeformed state as shown in FIG. 8, the stepped edge 62 is shaped to fit in the notch of the housing formed by step portion 26*b* and inner ledge portion 26*c*. When exterior housing 20 is secured to the door 50 surface, as shown in FIG. 9, the thickness of edge 62 is compressed between inner ledge portion 26*c* and the door surface to seal against entry of water and air. The contact between reciprocal edge 62 and inner ledge portion 26*c* seals in the y-direction. Additionally, without wishing to be bound by theory, the deformation of reciprocal edge 62 from compression against the door causes the edge 62 to bulge out in directions parallel to the door. This causes edge 62 to compress against step surface 26*b* as well, further creating a seal against water and air inflow in an x-direction. Thus, the shapes of stepped edge 26 and edge 62 allows the EM locking device 10, when assembled, to be sealed against fluid inflow in multiple directions, improving the sealing efficacy of the EM locking device.

Figure 4:
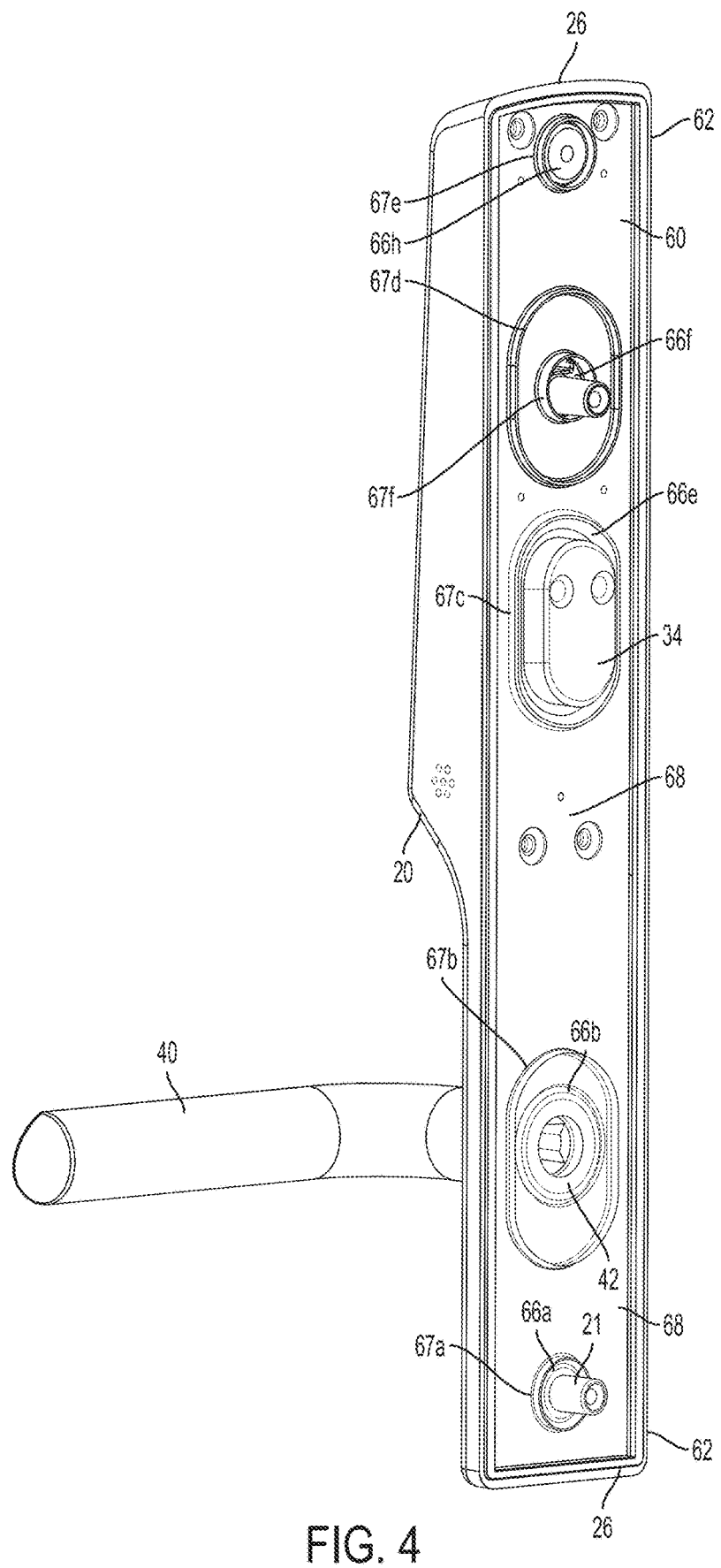
FIG. 4 is a rear, left perspective view of the exterior portion of the electromagnetic door lock of FIG. 1.
Figure 5:
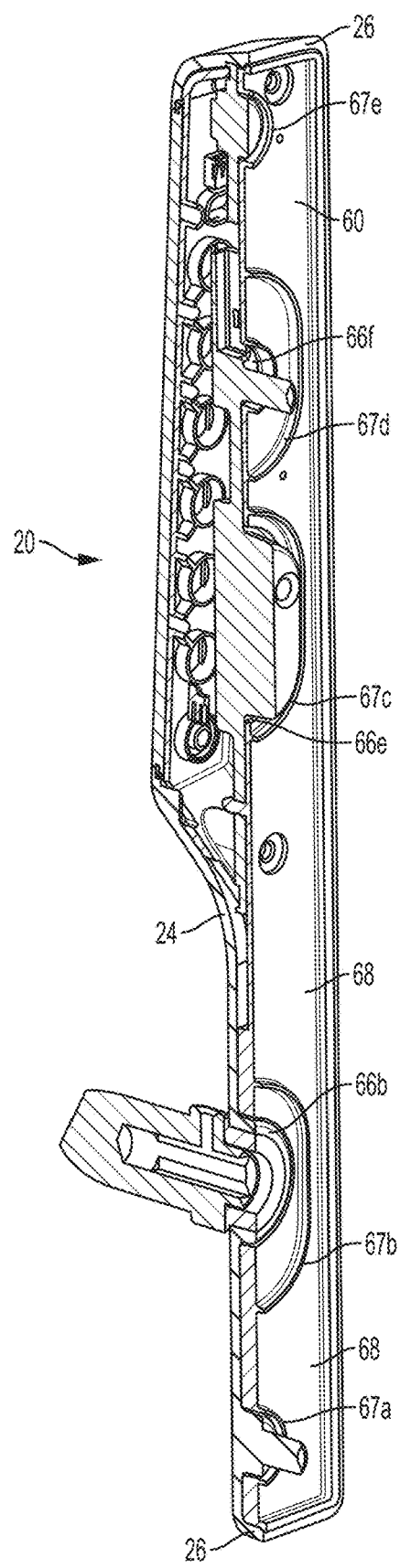
FIG. 5 is a left, cutaway view of the exterior portion of the electromagnetic door lock of FIG. 4.

Openings 66*a*-66*i*, exist in the gasket 60 to allow attachment mechanisms, data and power connections, and latch driving mechanisms to extend from the housing 20 into/through the door. This allows the aforementioned mechanisms and connections to interact with the door, or the mortise lock 110, or with the interior portion 70 of the EM locking device. To mitigate air and water flow potentially entering exterior housing 20 through openings 66*a*-66*i*, in some embodiments of the EM locking device 10, as best shown in FIG. 4, the inner gasket 60 includes a plurality of compressible ribs 67*a*-67*f* that extend towards the surface of the door from the inner facing surface of inner gasket 60. As seen in FIGS. 4 and 5, these compressible ribs surround at least some of the openings 66*a*-66*i*. When the exterior housing 20 is mounted on the surface of the door, the inner face of exterior housing 20 is pressed against the surface of the door, compressing compressible ribs 67*a*-67*f* against the door. Compressing the compressible ribs, which surround the openings 66*a*-66*i*, form an air and water tight barrier around the openings, mitigating any potential air and water flow entering those openings. The compressible ribs are deformable to the degree that the compressible ribs flatten against the door surface and bulge out transverse to the door surface without interfering with attachment of exterior housing 20 to the door surface. In one embodiment, an opening is surrounded by a corresponding compressible rib. The compressible rib may be spaced from the opening. The compressible rib may extending circumferentially about the opening. In one embodiment, as shown in FIG. 4, a first compressible rib 67*f* surrounds the opening 66*f* and a second compressible rib 67*d* surrounds the first compressible rib 67*f*. One of skill in the art should understand that any number of compressible ribs of any cross-sectional shape at any radial distance from the openings could be used as long as they substantially reduce air or water reaching the openings.

Figure 10:
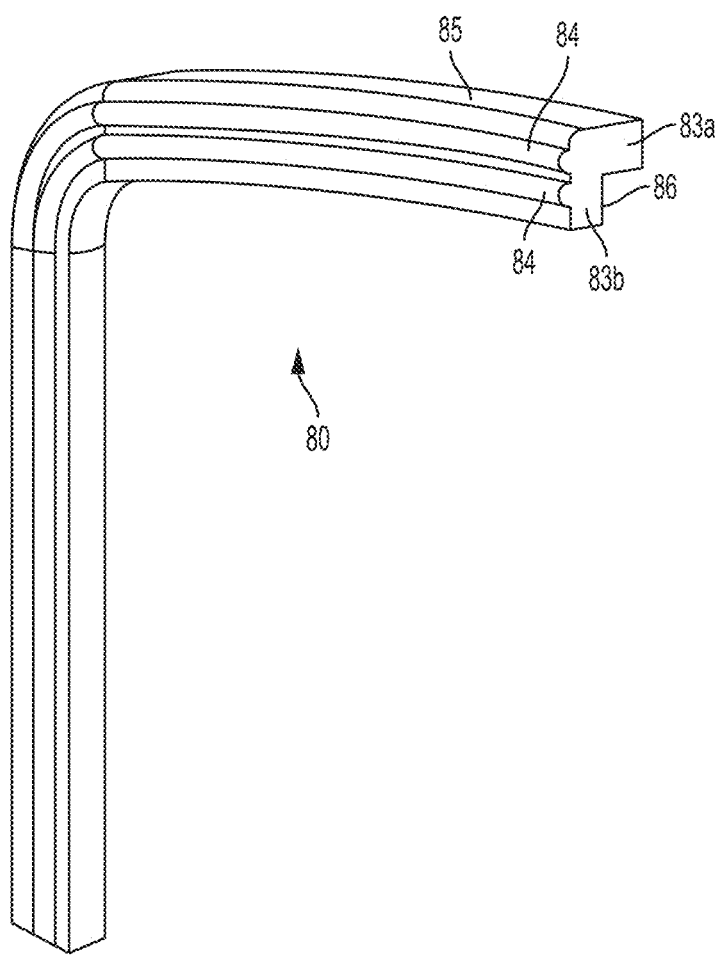
FIG. 10 is a perspective view of a portion of an outer gasket of the gasket system according to one embodiment.

Referring to FIGS. 7 and 10, the peripheral edge 29 of housing front opening 28 has a flat surface 29*a* facing the housing interior portion, a perpendicular surface 29*b* extending outwardly perpendicular to flat portion 29*a*, and an outer ledge portion 29*c*, extending parallel to flat surface 29*a* but recessed outwardly. Outer gasket 80 is substantially "L" shaped, with one leg 83*a* extending inwards toward the door, and the other leg 83*b* extending radially inward. By virtue of this shape, outer gasket 80 has an outer face 85 that conforms to the recess defined by perpendicular surface 29*b* and outer ledge portion 29*c*, as well as an inner face 86 that conforms with a reciprocal step feature 81 extending from touch pad 30. In an undeformed state prior to final attachment of the exterior housing 20 to the door, the outer gasket 80 can substantially occupy the aforementioned recess or corner defined by perpendicular surface 29*b* and inner ledge portion 29*c*, while the reciprocal step feature 81 extending from touch pad 30 can substantially occupy the corner of the inner face 86 of outer gasket 80. When the EM locking device 10 is fully assembled and attached to the door, perpendicular surface 29*b* and outer ledge portion 29*c* both press against, and deform, outer gasket 80 against reciprocal step feature. This creates seals in multiple directions between the exterior housing 20 and the touch pad 30, mitigating water and air inflow from the outer surfaces of the EM locking device 10.

As should be understood by those of skill in the art, while this embodiment of EM locking device 10 includes a touch pad set into the housing, the design of outer gasket 80 could be used in embodiments without a touch pad by simply replacing the touch pad with a section of housing to also includes a reciprocal step feature. In addition, some embodiments of the EM locking device that lack a touch pad could simply have an exterior housing that covers the entire exterior surface of the EM locking device.

In some embodiments, surfaces of the inner gasket 60 and/or outer gasket 80 could include ridges 84, shown for example on front gasket 80 in FIG. 10. Ridges 84 may extend from the surfaces of either of the inner and outer gaskets. These ridges 84 provide additional material that become compressed against the compressing surfaces, increasing the amount of compressed gasket material and improving the sealing efficacy by reducing the likelihood of gaps between the sealing surfaces and the compressed gaskets. While the depicted embodiment shows a set of two ridges 84, one of skill should understand that any number of ridges of any size could be used as long as the ridges can be sufficiently compressed to a degree that the EM locking device can be assembled without substantial difficulty.

Figure 3:
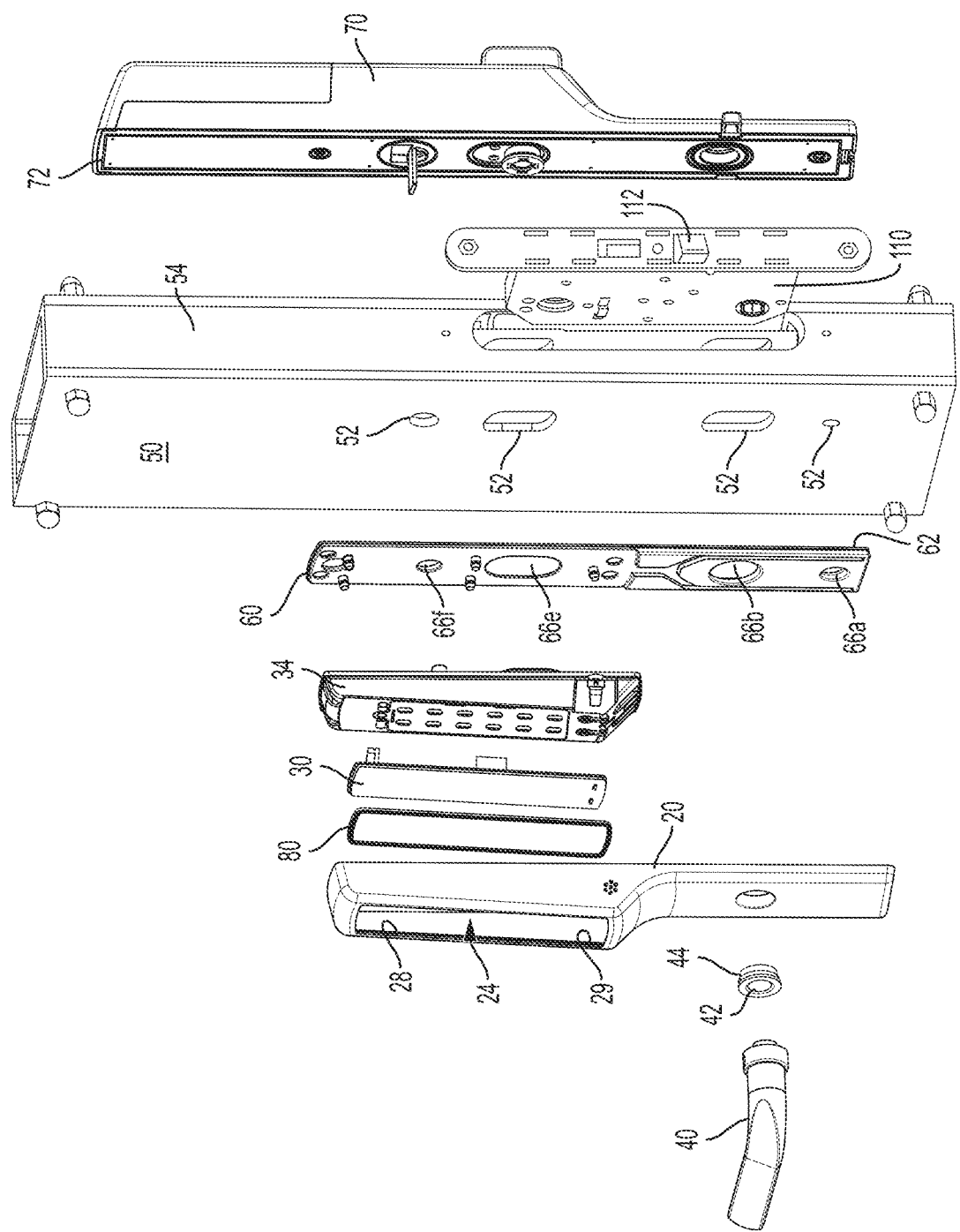
FIG. 3 is a right, exploded view of the entire electromagnetic door lock of FIG. 2, including the door, lock portion, and interior portion.

As shown in FIG. 3, the EM locking device 10 may include interior portion 70, with its own interior gasket 72, attached to the inside surface of the door 50. Interior gasket 72 also includes openings which allow passage of: fasteners for securing the housing, power and/or signal connections, and/or drive mechanisms operatively connecting the EM lock device to the door latch or deadbolt.

Referring to FIG. 3, interior gasket 72 and the housing of interior portion 70 in some embodiments are designed to include a stepped edge sealing system identical in mechanism to that of the interaction between stepped edge 26 and reciprocal edge 62 of the exterior portion of the EM locking device 10. This ensures that the internal portions EM locking device 10 are similarly sealed in multiple directions against air and water inflow from the inside environment. In still other embodiments, interior gasket 72 also includes compressible ribs extending from the surface of interior gasket 72 that circumferentially surround the openings in interior gasket 72. When the interior portion 70 is attached to the door, the compressible ribs are compressed against the door, obstructing water and air flow to the openings in interior gasket 72.

Drive mechanisms extending into the door 50 can interact with a variety of existing lock sets depending on the embodiment. In the depicted embodiment, EM locking device 10 controls mortise lock 110, a mortise-type lock as shown, including mortise latch 112. It should be understood however that the EM locking device may be employed with any other type of locking device or lockset including but not limited to cylindrical locks, bored locks, or tubular locks.

To install the gaskets of the EM locking device, the outer gasket is placed between the exterior housing 20 and touch pad 30 prior to the housing 20 being secured over touch pad 30 and printed circuit board housing 34. This allows a user to ensure that outer gasket 80 is positioned between the step feature of touchpad 30 and the recess defined by step portion 29*b* and inner ledge portion 29*c*. The O-ring 44 is placed around bushing 42, and the bushing 42 is positioned in the handle opening 22, securing the O-ring 44 in the housing 20, sealing the handle opening 22. Back gasket 60 is placed between the exterior housing 20 and the door's 50 exterior surface, ensuring that the inner gasket 60 is aligned with the open-faced back of the exterior housing 20 such that the inner gasket 60 obstructs the entire open-faced back with the exception of the aforementioned openings 66*a*-66*i*. The exterior housing 20 is then secured by fasteners or other means to the door surface over each of the aforementioned inner components. In securing outer housing 20 to the door surface, the reciprocal edge 62 of inner gasket 60 is compressed between the stepped edge 26 and the door surface. Between the O-ring 44, the outer gasket 80, and the inner gasket 60 the exterior housing 20 should be fully sealed in multiple directions against the entry of water or air into the interior of exterior housing 20.

The material for the gasket 60, 80 may be any suitable material that can compress and create a suitable seal. In one embodiment, the gasket is formed of a flexible material. In one embodiment, the gasket is formed from a rubber-like material. In one embodiment, the gasket is formed silicone rubber material. Plastic materials may also be used. The gasket body may have a thickness of approximately 2 mm. In one embodiment, the height of the compressible rib is about 3 mm. In one embodiment, the compressible rib may have a height of about 2 mm. In one embodiment, the width of the compressible rib may be about 0.5 mm, about 0.8 mm or about 1 mm, yielding a width to height ratio of about 0.5:3; about 0.8:3, about 1:3, about 0.5:2, about 0.8:2, and about 1:2. In embodiments with nested compressible ribs, the inner compressible rib has a width to height ratio of about 0.5:3 and the outer compressible rib has a width to height ratio of about 1:2.

Various aspects of the present disclosure may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the embodiments described herein may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Further, some actions are described as taken by a "user." It should be appreciated that a "user" need not be a single individual, and that in some embodiments, actions attributable to a "user" may be performed by a team of individuals and/or an individual in combination with computer-assisted tools or other mechanisms.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. An electromechanical locking device for a door, the device comprising:
    a housing having an open back with a stepped edge formed around the periphery of the open back of the housing, the stepped edge defined by a distal flat surface substantially parallel to a door surface, a perpendicular surface extending perpendicularly away from the door surface from the distal flat surface, and an inner ledge portion extending parallel to the door surface from the perpendicular surface; and
    a gasket constructed and arranged to cover the open back of the housing, having a step extending from edges of the gasket,
    wherein the step is sized and shaped to conform to the stepped edge such that, in an undeformed state, the gasket is disposed over the open back of the housing with the step contacting both the perpendicular surface and the inner ledge portion of the stepped edge, and
    wherein, when the housing is installed on the door, the distal flat surface of the housing contacts the door surface, and the step of the gasket is compressed between the inner ledge portion of the housing and the door surface, mitigating passage of water or air into the housing.

2. The electromechanical locking device of claim 1, wherein in the undeformed state, the gasket is disposed over the open back of the housing with the step contacting both the perpendicular surface and the inner ledge portion of the stepped edge without extending over the distal flat surface of the stepped edge.

3. The electromechanical locking device of claim 1, wherein the gasket extends continuously over the open back of the housing and wherein the gasket includes an opening and a corresponding perpendicularly extending compressible rib surrounding the opening.

4. The electromechanical locking device of claim 3, wherein the compressible rib surrounding the opening is spaced from the peripheral edge of the opening.

5. The electromechanical locking device of claim 3, wherein a first compressible rib surrounds the opening and a second compressible rib surrounds the first compressible rib.

6. The electromechanical locking device of claim 1, wherein when the step of the gasket is compressed and deformed between the inner ledge portion of the housing and the door surface, the step is also compressed against the perpendicular surface, compressing the step in multiple directions and mitigating passage of water and air in multiple directions.

7. The electromechanical locking device of claim 1, wherein the housing includes a front opening, the front opening having a peripheral edge with a flat surface facing an interior of the housing, a front perpendicular surface extending perpendicularly from the flat surface away from the housing interior, and an outer ledge portion extending perpendicularly from the perpendicular surface and lying parallel to the flat surface, together defining a corner, the device further including a front gasket having an "L" shape, sized and shaped such that in an undeformed state, the front gasket may be disposed within the corner.

8. The electromechanical locking device of claim 7, wherein the front gasket includes at least one ridge disposed against the outer ledge portion when the electromechanical locking device is in an assembled state.

9. The electromechanical locking device of claim 1, wherein the housing has a handle opening for a latch handle.

10. The electromechanical locking device of claim 9, further comprising a latch handle and a bushing disposed about a portion of the latch handle, and an O-ring disposed around the bushing, wherein when the bushing is disposed in the handle opening of the housing, the O-ring is compressed against a periphery of the handle opening, mitigating passage of air or water through the handle opening.

11. An electromechanical locking device for a door, the device comprising:
a housing having an open back with a stepped edge formed around the periphery of the open back of the housing, the stepped edge defined by a distal flat surface substantially parallel to a door surface, a perpendicular surface extending perpendicularly away from the door surface from the distal flat surface, and an inner ledge portion extending parallel to the door surface from the perpendicular surface; and
a gasket constructed and arranged to cover the open back of the housing, having a step extending from edges of the gasket, the gasket further including an opening and a corresponding perpendicularly extending compressible rib surrounding the opening,
wherein the step is sized and shaped to conform to the stepped edge such that, in an undeformed state, the gasket is disposed over the open back of the housing with the step contacting both the perpendicular surface and the inner ledge portion of the stepped edge, and
wherein, when the housing is installed on the door, the distal flat surface of the housing contacts the door surface, and the step of the gasket is compressed between the inner ledge portion of the housing and the door surface, mitigating passage of water or air into the housing and wherein, when the housing is installed on the door, the compressible rib contacts the door surface and is compressed to further mitigate passage of water or air into the housing.

12. The electromechanical locking device of claim 11, wherein the compressible rib surrounding the opening is spaced from the peripheral edge of the opening.

13. The electromechanical locking device of claim 11, wherein a first compressible rib surrounds the opening and a second compressible rib surrounds the first compressible rib.

14. The electromechanical locking device of claim 11, wherein the housing includes a front opening, the front opening having a peripheral edge with a flat surface facing an interior of the housing, a front perpendicular surface extending perpendicularly from the flat surface away from the housing interior, and an outer ledge portion extending perpendicularly from the perpendicular surface and lying parallel to the flat surface, together defining a corner, the device further including a front gasket having an "L" shape, sized and shaped such that in an undeformed state, the front gasket may be disposed within the corner.

15. The electromechanical locking device of claim 14, wherein the front gasket includes at least one ridge disposed against the outer ledge portion when the electromechanical locking device is in an assembled state.

16. The electromechanical locking device of claim 11, wherein the housing has a handle opening for a latch handle and wherein the device further comprises a latch handle and a bushing disposed about a portion of the latch handle, and an O-ring disposed around the bushing, wherein when the bushing is disposed in the handle opening of the housing, the O-ring is compressed against a periphery of the handle opening, mitigating passage of air or water through the handle opening.

* * * * *